(12) United States Patent  
Cheng et al.

(10) Patent No.: US 9,232,667 B2
(45) Date of Patent: Jan. 5, 2016

(54) DISPLAY DEVICE

(71) Applicants: Shun-Ying Cheng, Hsin-Chu (TW); Bing-Han Tsai, Hsin-Chu (TW); Chun-Chung Hsiao, Hsin-Chu (TW)

(72) Inventors: Shun-Ying Cheng, Hsin-Chu (TW); Bing-Han Tsai, Hsin-Chu (TW); Chun-Chung Hsiao, Hsin-Chu (TW)

(73) Assignee: Young Lighting Technology Inc., Hsin-chu (TW)

( * ) Notice: Subject to any disclaimer, the term of this patent is extended or adjusted under 35 U.S.C. 154(b) by 16 days.

(21) Appl. No.: 14/151,822

(22) Filed: Jan. 10, 2014

(65) Prior Publication Data

US 2015/0116607 A1    Apr. 30, 2015

(30) Foreign Application Priority Data

Oct. 30, 2013   (TW) .............................. 102139365 A

(51) Int. Cl.
- *G02F 1/1333* (2006.01)
- *H05K 5/02* (2006.01)
- *H05K 5/03* (2006.01)
- *G06F 1/16* (2006.01)

(52) U.S. Cl.
CPC .. *H05K 5/02* (2013.01); *G06F 1/16* (2013.01); *H05K 5/0247* (2013.01); *H05K 5/03* (2013.01)

(58) Field of Classification Search
CPC .............. G02F 1/133308; G02F 2001/133314; G02F 1/1333; H05K 5/03; H05K 5/02; H05K 5/0247; G06F 1/16
USPC ..................... 349/58; 362/632–634
See application file for complete search history.

(56) References Cited

U.S. PATENT DOCUMENTS

| | | | |
|---|---|---|---|
| 2008/0174730 A1* | 7/2008 | Lee et al. | 349/149 |
| 2010/0202105 A1* | 8/2010 | Chang | 361/679.27 |

FOREIGN PATENT DOCUMENTS

| | | |
|---|---|---|
| CN | 102117109 A | 7/2011 |
| CN | 102915134 A | 2/2013 |
| CN | 102981665 A | 3/2013 |
| CN | 102998818 A | 3/2013 |
| TW | 200416417 | 9/2004 |
| TW | 200944878 | 11/2009 |
| TW | 201232100 | 8/2012 |
| TW | 201241512 | 10/2012 |
| TW | M447073 | 2/2013 |
| TW | M447074 | 2/2013 |

OTHER PUBLICATIONS

"Office Action of Taiwan Counterpart Application", issued on Jun. 29, 2015, p. 1-p. 6.

* cited by examiner

*Primary Examiner* — Nathanael R Briggs
(74) *Attorney, Agent, or Firm* — Jianq Chyun IP Office

(57) ABSTRACT

A display device includes a casing, a frame, a backlight module, at least one cable, and a display panel. The casing has a display opening. The frame is disposed in an inner edge of the display opening, wherein the frame has at least a cable management groove and a support surface. The backlight module is disposed on the frame. The cable is disposed in the cable management groove. The display panel is disposed on the frame and located in the display opening, wherein an edge portion of the display panel is located on the support surface, and the support surface supports the edge portion of the display panel. A part of the cable management groove is located under the display panel and at least partially overlapped with the edge portion.

13 Claims, 2 Drawing Sheets

DISPLAY DEVICE

CROSS-REFERENCE TO RELATED APPLICATION

This application claims the priority benefit of Taiwan application serial no. 102139365, filed on Oct. 30, 2013. The entirety of the above-mentioned patent application is hereby incorporated by reference herein and made a part of this specification.

BACKGROUND OF THE INVENTION

1. Field of the Invention

The invention relates to a display device, and more particularly, to a display device with a cable management groove.

2. Description of Related Art

Owing to the advancement of semiconductor devices and display technology, electronic products have been continuously developed toward the trend of small size, multi-function and easy carry. Common portable electronic products include notebook computers, tablet computers and mobile phones. In general, all the electronic products of the foregoing description have a display device to display images for users to watch. Take a notebook computer for an example, when the electronic components such as an antenna, an image capture device, a microphone and so on, are disposed in the display device, a cable generally needed to be disposed in the display device such that these electronic components may transfer signals and receive power through the cable.

In detail, a back plate and a mold frame are generally disposed in a casing of the display device for supporting a backlight module and a display panel, and assembled with a frame to form the display device. In this way, the number of the components of the display device is more, thus the cost of manufacture of the display device is increased. In additional, the cable is usually disposed around the display panel of the display device, however, this disposing manner may increase the width of the display device and it may against the narrow-frame design trend of the portable electronic products.

China patent number CN 102117109A discloses a portable computer device, wherein a display system may have touch sensitive function, a transparent protective layer is a cover glass on the top, and a seal component is an elastic material and disposed between the cover glass and a casing. China patent number CN 102998818A discloses a display device, wherein a liquid crystal panel is adhered on a transparent plate by an adhesive layer, and the transparent plate is for example a protective glass. Taiwan patent number TW 201232100 discloses a display device, wherein a cable management area is defined by an edge portion of a display panel and a side surface of a backlight module. Taiwan patent number TW M447073 discloses a support frame of a display module, wherein a rubber protective layer includes a cushioning portion and a position-limiting portion, the cushioning portion is attached between an assemble frame and the display module, and the position-limiting portion is used for fastening a cable. Taiwan patent number TW M447074 discloses a display frame, wherein a cushioning portion of a rubber cushioning layer is attached between a support frame and a display module. China patent number CN 102915134A discloses a touch panel, wherein a protective unit attaches to a touch sensing unit by a glue, and the touch sensing unit attaches to a panel unit by a glue. China patent number CN 102981665A discloses a touch panel, wherein a protective unit attaches to a touch sensing unit by a glue, and the touch sensing unit attaches a panel unit by a glue.

SUMMARY OF THE INVENTION

The invention provides a display device which may save the cost of manufacture and have smaller width.

The other purposes and advantages of the invention may be further understood from the technical features of the disclosures of the invention.

For achieving the foregoing at least one of the purposes or the other purposes, in one embodiment of the invention, a display device is provided that includes a casing, a frame, a backlight module, at least a cable, and a display panel. The casing has a display opening. The frame is disposed in an inner edge of the display opening, wherein the frame has at least a cable management groove and a support surface. The backlight module is disposed on the frame. The cable is disposed in the cable management groove. The display panel is disposed on the frame and located in the display opening, wherein an edge portion of the display panel is located on the support surface, and the support surface supports the edge portion of the display panel. A part of the cable management groove is located under the display panel and at least partially overlapped with the edge portion.

In one embodiment of the invention, the frame has a supporting portion connected with an inner wall of the frame, and the backlight module is located on the supporting portion.

In one embodiment of the invention, the display device further includes a back plate, wherein the frame has an accommodating opening, the back plate is connected with the frame and extends into the accommodating opening, and the backlight module is located in the accommodating opening and on the back plate.

In one embodiment of the invention, a part of the back plate is disposed on the support surface and located between the support surface and the display panel.

In one embodiment of the invention, a part of the back plate is fixed at the inner wall of the accommodating opening.

In one embodiment of the invention, the display device further includes a touch panel, wherein the touch panel is disposed on the frame and covers the display panel and at least a part of the frame, and the display panel is adhered with the touch panel.

In one embodiment of the invention, the display device further includes a transparent protecting plate, wherein the transparent protecting plate is disposed on the frame and covers the display panel and at least a part of the frame, and the display panel is adhered with the transparent protecting plate.

In one embodiment of the invention, the display device further includes a front bezel, wherein the front bezel is disposed on the frame and covers a part of the display panel and at least a part of the frame, and the front bezel exposes a display area of the display panel.

In one embodiment of the invention, the casing has a side wall, the side wall surrounds the frame and has a positioning rib, the frame has a positioning groove, and the positioning rib is located in the positioning groove such that the casing and the frame are fixed with each other.

In one embodiment of the invention, the display device further includes a power storage device, wherein the power storage device is disposed between the backlight module and the casing and surrounded by the casing.

In one embodiment of the invention, the display device further includes a circuit board disposed between the casing and the frame.

In one embodiment of the invention, the frame has a flange located between the display panel and the casing.

In one embodiment of the invention, wherein the cable management groove and the support surface are located at opposite sides of the frame, and the edge portion of the display panel, the support surface, the frame, the cable management groove, and the cable are arranged in sequence from up to down along a cross-section, wherein the cross-section passes through the cable management groove and the support surface along a direction perpendicular to the display panel.

Base on the foregoing description, the embodiments of the invention have at least one of the advantages below. The display panel and the backlight module are both disposed on the frame, such that the frame is capable of supporting both the display panel and the backlight module. Accordingly, the display device does not require additional mold frame for supporting the backlight module, such that the cost of manufacture of the display device is saved. In addition, the cable management groove of the frame is located under the display panel and at least partially overlapped with the edge portion of the display panel, such that the cable management groove and the cable therein may occupy less space around the display panel, and the display device may have smaller width and fit the narrow-frame design trend of the portable electronic products.

Other objectives, features and advantages of the invention will be further understood from the further technological features disclosed by the embodiments of the invention wherein there are shown and described preferred embodiments of this invention, simply by way of illustration of modes best suited to carry out the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
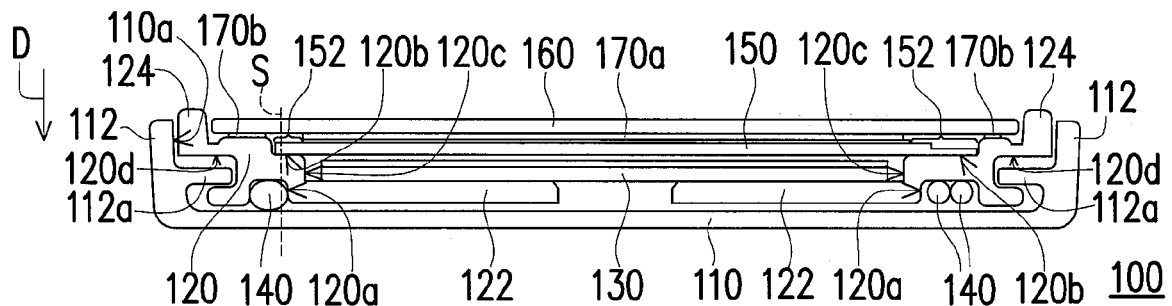
FIG. 1 is a cross-section diagram illustrating the display device of an embodiment of the invention.

FIG. 1 is a cross-section diagram illustrating the display device of an embodiment of the invention. Referring to FIG. 1, the display device 100 of the embodiment includes a casing 110, a frame 120, a backlight module 130, at least a cable 140 (three are illustrated), and a display panel 150. The casing 110 has a display opening 110a. The frame 120 is disposed in an inner edge of the display opening 110a, and the frame 120 has at least a cable management groove 120a (two are illustrated) and a support surface 120b. The backlight module 130 is disposed on the frame 120. The cable 140 is disposed in the cable management groove 120a of the frame 120, and the foregoing cable 140, for example, is the cable of the electronic components, such as an antenna, an image capture device or a microphone of display device 100. The display panel 150 is disposed on the frame 120 and located in the display opening 110a of the casing 110. An edge portion 152 of the display panel 150 is located on the support surface 120b of the frame 120, and the support surface 120b supports the edge portion 152 of the display panel 150. A part of the cable management groove 120a is located under the display panel 150 and at least partially overlapped with the edge portion 152 of the display panel 150.

Under the foregoing configuration method, the display panel 150 and the backlight module 130 both are disposed on the frame 120 such that the frame 120 has the functions of supporting both the display panel 150 and the backlight module 130. Accordingly, the display device 100 does not require additional mold frame for supporting the display panel 150 and additional back plate for supporting the backlight module 130, such that it may save the cost of manufacture and reduce the number of the components of the display device 100. In addition, since the cable management groove 120a of the frame 120 at least partially overlapped with the edge portion 152 of the display panel 150, the cable management groove 120a and the cable 140 therein may occupy less space around the display panel 150, and the display device 100 may have smaller width and fit the narrow-frame design trend of the portable electronic products.

In detail, in the embodiment, the cable management groove 120a and support surface 120b are located at opposite sides of the frame 120, and the edge portion 152 of the display panel 150, the support surface 120b, the frame 120, the cable management groove 120a, and the cable 140 are arranged in sequence from up to down along a cross-section S, wherein the cross-section S passes through the cable management groove 120a and the support surface 120b along a direction D perpendicular to the display panel 150. In addition, the display device 100 further includes a touch panel 160 which is disposed on the frame 120 and adhered with the frame 120 by an adhesive layer 170b (for example, a double side tape) to cover the display panel 150 and at least a part of the frame 120. The display panel 150 is adhered with the touch panel 160 by an adhesive layer 170a (for example, an optical adhesive) such that it does not need additional adhesive tape to fix the display panel 150. In other embodiments, it may replace the touch panel 160 with a transparent protective plate, the display panel 150 may be adhered with the transparent protective plate, and the transparent protective plate may cover the display panel 150 and at least a part of the frame 120, wherein the transparent protective plate, for example, is a transparent glass plate or a transparent plastic plate, and the invention is not limited thereto.

In the embodiment, the frame 120 has a supporting portion 122 connected with an inner wall of an accommodating opening 120c of the frame 120, and the backlight module 130 is located on the supporting portion 122 and supported by the supporting portion 122. In addition, the casing 110 has a side wall 112, the side wall 112 surrounds the frame 120 and has a positioning rib 112a. The frame 120 has a positioning groove 120d, and the positioning rib 112a is located in the positioning groove 120d such that the casing 110 and the frame 120 are fixed with each other. In other embodiments, the casing 110 and the frame 120 may be fixed with each other in other proper methods, and the invention is not limited thereto.

The display device 100 of the embodiment, for example, is a display screen of a notebook computer. The frame 120 has a flange 124 located between the display panel 150 and the casing 110 and located between the touch panel 160 and the casing 110. The flange 124 extends out of the touch panel 160, wherein the material of the flange 124 is a cushioning material, such as a plastic or a rubber, and it may be the cushioning material between the display panel 150 and the casing 110 or between the touch panel 160 and the casing 110. In additional, when the display screen (Namely, the display device 100) is closed to the host of the notebook computer, since the flange 124 extends out of the touch panel 160 to contact the host of the notebook computer, so as to prevent a damage from that the display screen and the host portion impact each other.

Figure 2:
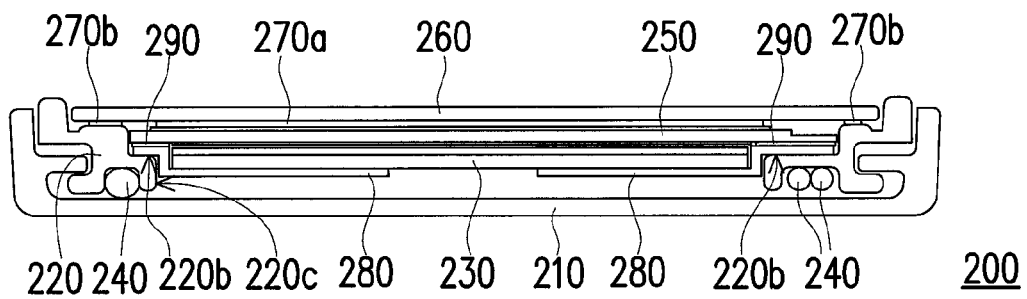
FIG. 2 is a cross-section diagram illustrating the display device of another embodiment of the invention.

FIG. 2 is a cross-section diagram illustrating the display device of another embodiment of the invention. In the display device 200 of FIG. 2, the configuration and the operation of the casing 210, the backlight 230, the cable 240, the display panel 250, the touch panel 260, the adhesive layer 270a, and the adhesive layer 270b are similar to the configuration and the operation of the casing 110, the backlight 130, the cable 140, the display panel 150, the touch panel 160, the adhesive layer 170a, and the adhesive layer 170b in FIG. 1, and a relevant description thereof is not repeated herein. The difference between the display device 200 and the display device 100 is that the frame 220 does not have the supporting portion 122 as illustrated in FIG. 1, and the display device 200 further includes a back plate 280. The back plate 280 is connected with the frame 220 and extends into an accommodating opening 220c of the frame 220. The backlight module 230 is located in the accommodating opening 220c of the frame 220 and on the back plate 280 to be supported by the back plate 280. In the embodiment, a part of the back plate 280 is disposed on the support surface 220b of the frame 220 and located between the support surface 220b and the display panel 250, and is adhered to the display panel 250 by the adhesive layer 290.

Figure 3:
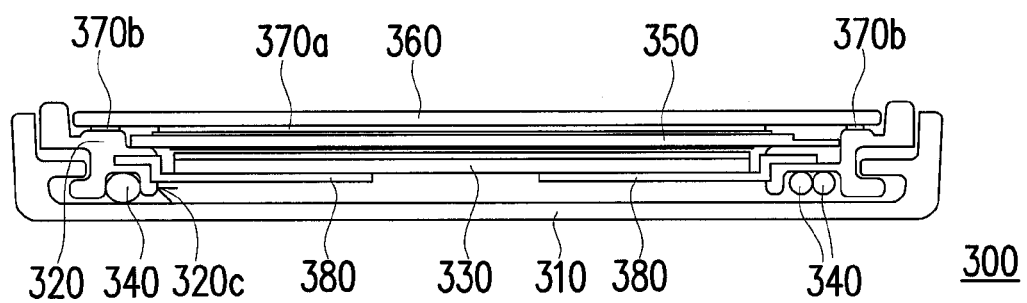
FIG. 3 is a cross-section diagram illustrating the display device of another embodiment of the invention.

FIG. 3 is a cross-section diagram illustrating the display device of another embodiment of the invention. In the display device 300 of FIG. 3, the configuration and the operation of the casing 310, the backlight 330, the cable 340, the display panel 350, the touch panel 360, the adhesive layer 370a, and the adhesive layer 370b are similar to the configuration and the operation of the casing 210, the backlight 230, the cable 240, the display panel 250, the touch panel 260, the adhesive layer 270a, and the adhesive layer 270b in FIG. 2, and a relevant description thereof is not repeated herein. The difference between the display device 300 and the display device 200 is that the back plate 380 for supporting the backlight module 330 is fixed at the inner wall of the accommodating opening 320c of the frame 320 by insert molding. In detail, a part of the back plate 380 is fixed at the inner wall of the accommodating opening 320c of the frame 320 by insert molding. In the other embodiments, the back plate 380 may be fixed at the inner wall of the accommodating opening 320c by screwing, engagement, or other proper methods, and the invention is not limited thereto.

Figure 4:
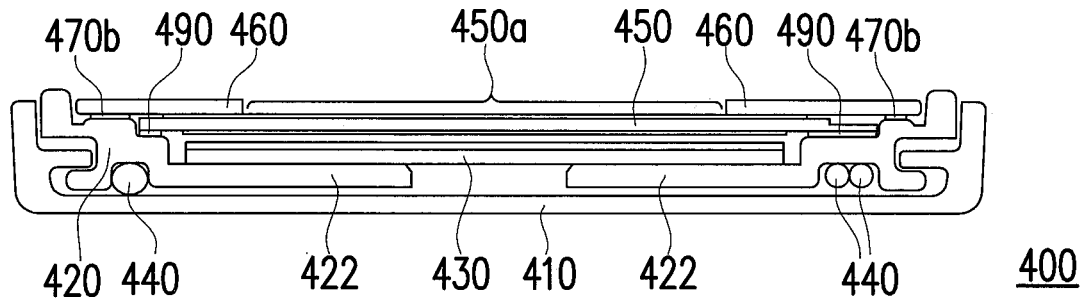
FIG. 4 is a cross-section diagram illustrating the display device of another embodiment of the invention.

FIG. 4 is a cross-section diagram illustrating the display device of another embodiment of the invention. In the display device 400 of FIG. 4, the configuration and the operation of the casing 410, the frame 420, the supporting portion 422, the backlight module 430, the cable 440, and the display panel 450 are similar to the casing 110, the frame 120, the supporting portion 122, the backlight module 130, the cable 140, and the display panel 150 in FIG. 1, and a relevant description thereof is not repeated herein. The difference between the display device 400 and the display device 100 is that the display device 400 does not have the touch panel 160 as illustrated in FIG. 1. The display device 400 includes a front bezel 460. The front bezel 460 is disposed on the frame 420 and covers a part of the display panel 450 and at least a part of the frame 420, and the front bezel 460 exposes a display area 450a of the display panel 450. In the embodiment, the front bezel 460 is, for example, a aluminum component and is adhered to the frame 420 by the adhesive layer 470b (for example, a double side tape), and the display panel 450 is adhered to the frame 420 by the adhesive layer 490, for example.

Figure 5:
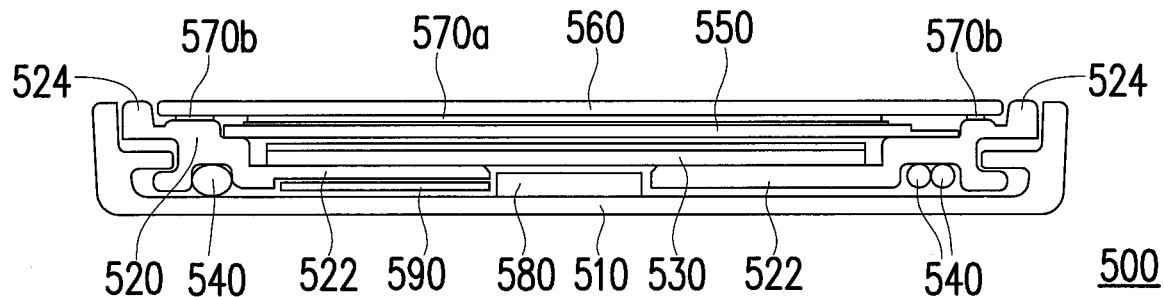
FIG. 5 is a cross-section diagram illustrating the display device of another embodiment of the invention.

FIG. 5 is a cross-section diagram illustrating the display device of another embodiment of the invention. In the display device 500 of FIG. 5, the configuration and the operation of the casing 510, the frame 520, the supporting portion 522, the backlight 530, the cable 540, the display panel 550, the touch panel 560, the adhesive layer 570a, and the adhesive layer 570b are similar to the casing 110, the frame 120, the supporting portion 122, the backlight 130, the cable 140, the display panel 150, the touch panel 160, the adhesive layer 170a, and the adhesive layer 170b in FIG. 1, and a relevant description thereof is not repeated herein. The difference between the display device 500 and the display device 100 is that the display device 500 is, for example, a tablet computer or a smart phone and further includes a power storage device 580 and a circuit board 590. The power storage device 580 is, for example, a battery and is disposed between the backlight module 530 and the casing 510 and surrounded by the frame 520. The circuit board 590 is, for example, a print circuit board and is disposed between the casing 510 and the frame 520. In addition, the flange 524 of the frame 520 is located between the display panel 550 and the casing 510 and located between the touch panel 560 and the casing 510. The flange 524 does not extend out of the touch panel 560. The flange 524 may be the cushioning material between the display panel 550 and the casing 510 or between the touch panel 560 and the casing 510.

Figure 6:
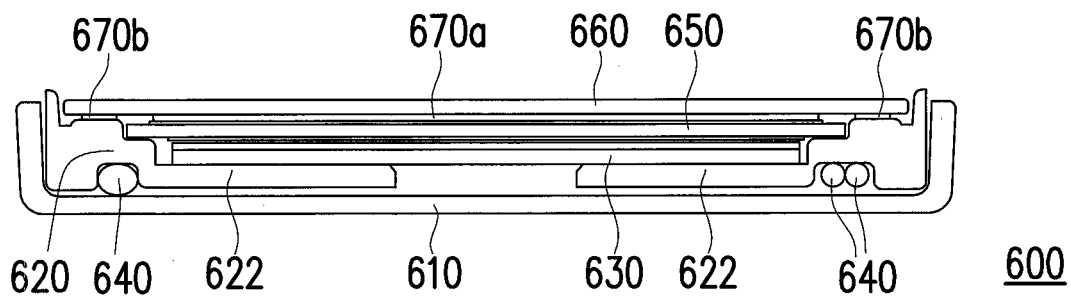
FIG. 6 is a cross-section diagram illustrating the display device of another embodiment of the invention.

FIG. 6 is a cross-section diagram illustrating the display device of another embodiment of the invention. In the display device 600 of FIG. 6, the configuration and the operation of the casing 610, the frame 620, the supporting portion 622, the backlight module 630, the cable 640, the display panel 650, the touch panel 660, the adhesive layer 670a, and the adhesive layer 670b are similar to the casing 110, the frame 120, the supporting portion 122, the backlight module 130, the cable 140, the display panel 150, the touch panel 160, the adhesive layer 170a, and the adhesive layer 170b in FIG. 1, and a relevant description thereof is not repeated herein. The difference between the display device 600 and the display device 100 is that the casing 610 does not have the positioning rib 112a as illustrated in FIG. 1, and the frame 620 does not have the positioning groove 120d as illustrated in FIG. 1 such that it may further decrease the width of the display device 600 and have more advantages for the narrow-frame design.

In summary, the embodiments of the invention have at least one of the advantages below. The display panel and the backlight module are both disposed on the frame, such that the frame is capable of supporting both the display panel and the backlight module. Accordingly, the display device does not require additional mold frame for supporting the backlight module, such that the cost of manufacture of the display device is saved. In addition, the cable management groove of the frame is located under the display panel and at least partially overlapped with the edge portion of the display panel, such that the cable management groove and the cable therein may occupy less space around the display panel, and the display device may have smaller width and fit the narrow-frame design trend of the portable electronic products.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display device, comprising:
   a casing having a display opening;
   a frame disposed in an inner edge of the display opening, wherein the frame has at least a cable management groove and a support surface, and the cable management groove is located at an underside of the frame and between the frame and the casing;
   a backlight module disposed on the frame;
   at least a cable disposed in the cable management groove; and
   a display panel disposed on the frame and located in the display opening, wherein an edge portion of the display panel is located on the support surface, the support surface supports the edge portion of the display panel, and a part of the cable management groove is located under the display panel and at least partially overlapped with the edge portion.

2. The display device as described in claim 1, wherein the frame has a supporting portion connected with an inner wall of the frame, and the backlight module is located on the supporting portion.

3. The display device as described in claim 1, further comprising a back plate, wherein the frame has an accommodating opening, the back plate is connected with the frame and extends into the accommodating opening, and the backlight module is located in the accommodating opening and on the back plate.

4. The display device as described in claim 3, wherein a part of the back plate is disposed on the support surface and located between the support surface and the display panel.

5. The display device as described in claim 3, wherein a part of the back plate is fixed at the inner wall of the accommodating opening.

6. The display device as described in claim 1, further comprising a touch panel, wherein the touch panel is disposed on the frame and covers the display panel and at least a part of the frame, and the display panel is adhered with the touch panel.

7. The display device as described in claim 1, further comprising a transparent protecting plate, wherein the transparent protecting plate is disposed on the frame and covers the display panel and at least a part of the frame, and the display panel is adhered with the transparent protecting plate.

8. The display device as described in claim 1, further comprising a front bezel, wherein the front bezel is disposed on the frame and covers a part of the display panel and at least a part of the frame, and the front bezel exposes a display area of the display panel.

9. The display device as described in claim 1, wherein the casing has a side wall, the side wall surrounds the frame and has a positioning rib, the frame has a positioning groove, and the positioning rib is located in the positioning groove such that the casing and the frame are fixed with each other.

10. The display device as described in claim 1, further comprising a power storage device, wherein the power storage device is disposed between the backlight module and the casing and surrounded by the casing.

11. The display device as described in claim 10, further comprising a circuit board disposed between the casing and the frame.

12. The display device as described in claim 1, wherein the frame has a flange located between the display panel and the casing.

13. The display device as described in claim 1, wherein the cable management groove and the support surface are located at opposite sides of the frame, and the edge portion of the display panel, the support surface, the frame, the cable management groove, and the cable are arranged in sequence from up to down along a cross-section, wherein the cross-section passes through the cable management groove and the support surface along a direction perpendicular to the display panel.

* * * * *